(12) United States Patent
Shimamura et al.

(10) Patent No.: US 6,348,755 B1
(45) Date of Patent: Feb. 19, 2002

(54) METHOD AND APPARATUS FOR DRIVING PIEZOELECTRIC TRANSFORMER

(75) Inventors: Junichi Shimamura; Mamoru Sakamoto; Kenji Kamitani, all of Tokyo (JP)

(73) Assignee: Taiyo Yuden, Co., Ltd., Tokyo (JP)

( * ) Notice: Subject to any disclaimer, the term of this patent is extended or adjusted under 35 U.S.C. 154(b) by 0 days.

(21) Appl. No.: 09/553,357

(22) Filed: Apr. 21, 2000

(30) Foreign Application Priority Data

Apr. 22, 1999 (JP) .......................................... 11-114834

(51) Int. Cl.[7] .......................................... H01L 41/107
(52) U.S. Cl. ........................................ 310/318; 310/359
(58) Field of Search .......................... 310/316.01, 318, 310/359

(56) References Cited

U.S. PATENT DOCUMENTS

| | | | |
|---|---|---|---|
| 5,796,213 A | 8/1998 | Kawasaki | 310/316 |
| 5,854,543 A | * 12/1998 | Satoh et al. | 310/316 |
| 6,013,969 A | * 1/2000 | Noma et al. | 310/318 |
| 6,144,139 A | * 11/2000 | Noma et al. | 310/316.01 |

* cited by examiner

*Primary Examiner*—Thomas M. Dougherty
(74) *Attorney, Agent, or Firm*—Lowe Hauptman Gilman & Berner, LLP

(57) ABSTRACT

It is an object of the present invention to provide a method and an apparatus for driving a piezoelectric transformer capable of always driving with maximum conversion efficiency regardless of changes in the input voltage level, load and temperature, etc. The method and apparatus for driving a piezoelectric transformer of the present invention generate a time-varying sweep voltage through a sweep circuit at predetermined regular intervals, thereby changing the frequency of a drive signal output from a voltage control oscillator, at this time detect a phase difference between the voltage and current generated on the primary side of the piezoelectric transformer by a phase difference detector, and hold the sweep voltage corresponding to the timing at which a maximum value detector detects the maximum value by a sample-and-hold circuit, thereby controlling the frequency of the drive signal so that the phase difference between the voltage and current on the primary side of the piezoelectric transformer always becomes a maximum value.

12 Claims, 9 Drawing Sheets

OUTPUT POWER

OUTPUT POWER

CONVERSION EFFICIENCY

INPUT PHASE DIFFERENCE

INPUT IMPEDANCE

OUTPUT POWER

OUTPUT POWER

CONVERSION EFFICIENCY

INPUT PHASE DIFFERENCE

INPUT IMPEDANCE

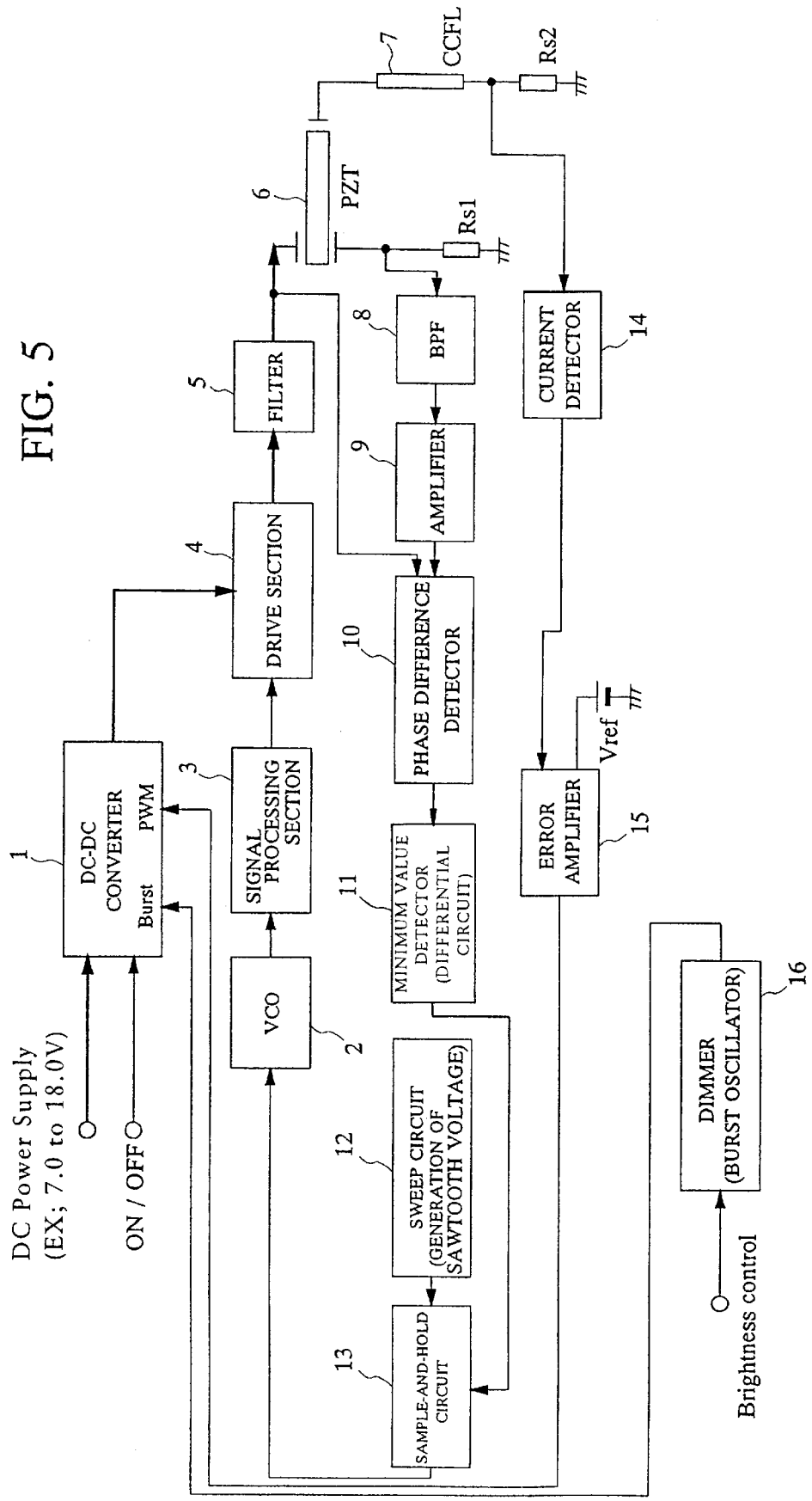

METHOD AND APPARATUS FOR DRIVING PIEZOELECTRIC TRANSFORMER

BACKGROUND OF THE INVENTION

1. Field of the Invention

The present invention relates to a method and an apparatus for driving a piezoelectric transformer used for a high-voltage power supply apparatus such as a discharge lamp starter for a liquid-crystal panel with backlighting, a copier and a page printer.

2. Description of the Related Art

A piezoelectric transformer is formed using a piezoelectric vibrator made up of a thin oblong sheet of piezoelectric material or a piezoelectric vibrator made by laminating a plurality of these thin oblong sheets. Piezoelectric materials used are barium titanate-based or lead zirconate titanate (PZT)-based piezoelectric ceramics, etc. The piezoelectric transformer consists of applying an AC (drive) voltage to an electrode (primary side) placed at one end of this piezoelectric vibrator in the thickness direction during a drive, exciting mechanical vibration and having another electrode (secondary side) at the other end of the piezoelectric vibrator convert this mechanical vibration to a voltage and outputting this voltage.

The above described piezoelectric transformer contains a resistance component, capacitance component, inductance component and configures a resonant circuit equivalently. Thus, it is conventionally believed that driving the piezoelectric transformer at a resonance frequency for this equivalent resonance circuit provides an efficient way of extracting electric power, that is, a high output voltage (power).

By the way, the resonance frequency of the aforementioned piezoelectric transformer also changes depending on conditions such as the input voltage level, load and temperature. Thus, to extract the performance of the piezoelectric transformer, it is necessary to change the drive frequency in accordance with changes in this resonance frequency. However, it is generally difficult to directly detect the resonance frequency of a circuit element in operation. Therefore, the drive frequency has been conventionally made to follow up changes in the resonance frequency by controlling the drive frequency so that the phase of the input voltage and the phase of the input current detected coincide or the difference between these two becomes constant.

However, the phase difference itself changes at the resonance frequency of the piezoelectric transformer depending on conditions such as the input voltage level, load and temperature. Thus, no matter how much the drive frequency is controlled so that the phase difference between the input voltage and input current of the piezoelectric transformer is constant, it is difficult to always extract power efficiently.

FIG. 1A to FIG. 1E illustrate examples of frequency characteristics of a piezoelectric transformer at an input voltage of 1 Vrms and load resistance of 100 kΩ with respect to output power, output voltage, conversion efficiency (=output power/input power; ratio of output power to input power), input phase difference (phase difference between input voltage and input current) and input impedance. Furthermore, FIG. 2A to FIG. 2E illustrate examples of frequency characteristics with the load resistance changed to 500 kΩ and FIG. 3A to FIG. 3E illustrate examples of frequency characteristics with the load resistance changed to 1 MΩ. Hereafter, FIG. 1A to FIG. 1E will be collectively called FIG. 1, FIG. 2A to FIG. 2E will be collectively called FIG. 2 and FIG. 3A to FIG. 3E will be collectively called FIG. 3.

From FIG. 1 to FIG. 3, it is clear that when load resistance is changed, all the characteristics of output power, output voltage, conversion efficiency, input phase difference and input impedance change. Therefore, controlling so that the phase difference between the input voltage and input current of the piezoelectric transformer becomes constant will result in the output power, output voltage and conversion efficiency, etc. changed according to the load condition.

FIG. 4 illustrates the input phase difference corresponding to a maximum conversion efficiency under different load conditions (load resistance of 100 kΩ, 500 kΩ and 1 MΩ) when the input voltage is changed (1, 2, 3, 4 and 5 Vrms).

SUMMARY OF THE INVENTION

It is an object of the present invention to provide a method and apparatus for driving a piezoelectric transformer capable of driving with a maximum conversion efficiency and supplying a relatively high output voltage regardless of changes in the input voltage level, load and temperature, etc.

A detailed study of the conventional characteristic examples shown in FIG. 1 to FIG. 3 shows that the frequency corresponding to a maximum conversion efficiency and the frequency corresponding to a minimum input phase difference coincide regardless of the magnitude of load resistance. This may be attributable to the fact that when the input phase difference reaches a minimum value, the power factor approaches 1 and the apparent power on the input side decreases, which results in maximum efficiency.

Thus, the present invention has made it possible to always drive the piezoelectric transformer with maximum conversion efficiency by inputting an AC signal at a frequency corresponding to a minimum phase difference between the voltage and current on the input side (primary side) to the piezoelectric transformer, regardless of changes in the load, etc.

On the other hand, regarding the conventional characteristic examples shown in FIG. 1 to FIG. 3, the frequency corresponding to a maximum conversion efficiency and the frequency corresponding to a maximum output power (voltage) do not coincide, but the frequency corresponding to the maximum output power is lower. Thus, the present invention inputs an AC signal with a frequency lower than the frequency corresponding to the minimum phase difference (input phase difference) between the input voltage and input current by 0 to 30% of the difference between the resonance frequency and antiresonance frequency of the piezoelectric transformer. That is, the present invention has made it possible to drive the piezoelectric transformer at a frequency lower than the frequency corresponding to the maximum conversion efficiency by a certain frequency, for example, a frequency intermediate between the frequency corresponding to the maximum conversion efficiency and the frequency corresponding to the maximum output power regardless of changes in the load, etc. This allows the piezoelectric transformer to be driven with high conversion efficiency and large output power.

Such a driving method is implemented by a piezoelectric transformer drive apparatus provided with a unit that controls the frequency of an AC signal so that the phase difference between the input voltage and input current on the primary side of the piezoelectric transformer becomes a minimum, or by a piezoelectric transformer drive apparatus provided with a unit that controls the frequency of an AC signal so that it is lower than the frequency corresponding to the minimum phase difference by 0 to 30% of the difference between the resonance frequency and antiresonance frequency of the piezoelectric transformer.

Here, the unit that controls the frequency of the AC signal so that the phase difference between the input voltage and input current for the piezoelectric transformer becomes a minimum can be implemented by a unit that sweeps the frequency of the AC signal, a unit that detects a phase difference between the input voltage and input current on the primary side of the piezoelectric transformer, a unit that detects a minimum value of this phase difference and a unit that holds the frequency of the AC signal when this minimum value is obtained.

A more specific unit to control the frequency of the AC signal input to the piezoelectric transformer so that the phase difference reaches a minimum value can be implemented by a voltage control oscillator that generates an AC signal at a frequency according to the input voltage, a sweep circuit that generates a time-varying sweep voltage as the input voltage for this voltage control oscillator, a phase difference detector that detects a phase difference between the voltage and current on the primary side of the piezoelectric transformer and outputs a signal corresponding to this phase difference, a minimum value detection circuit that detects a minimum value of this phase difference signal and a sample-and-hold circuit that supplies the sweep voltage to the voltage control oscillator and holds the voltage when the minimum value of the phase difference signal is obtained and supplies it to the voltage control oscillator.

In this case, it is possible to reduce deviation of the conversion efficiency from its maximum value during a drive by sweeping the frequency of the AC signal at predetermined regular intervals or, in addition to this, when conditions of load and input, etc. are changed.

Furthermore, another unit that controls the frequency of an AC signal input to the piezoelectric transformer so that the phase difference reaches a minimum value can be implemented by a voltage control oscillator that generates an AC signal at a frequency according to the input voltage, a phase comparator that compares the phases of the voltage and current on the primary side of the piezoelectric transformer and supplies a voltage that holds a certain value when this phase difference reaches a minimum value under a predetermined load condition to the voltage control oscillator and a phase adjustment circuit that adjusts the phase of a signal input to the phase comparator above according to changes of the load condition, etc.

In this case, it is possible to improve the conversion efficiency during adjustment of power to the load, by controlling the amount of phase adjustment by the phase adjustment circuit according to the amount of control of adjusting power supplied to the load.

BRIEF DESCRIPTION OF THE DRAWINGS

FIG. 5 is a block diagram showing a first embodiment of a piezoelectric transformer drive apparatus of the present invention;

DETAILED DESCRIPTION OF THE PREFERRED EMBODIMENTS

Figure 1A:
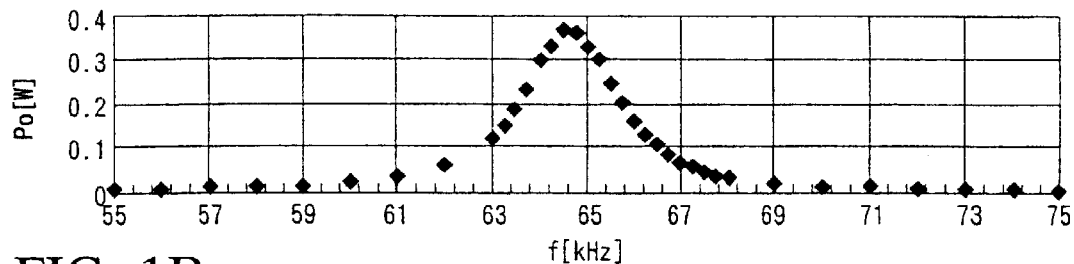
FIG. 1A to FIG. 1E illustrate examples of frequency characteristics of a piezoelectric transformer with respect to output power, output voltage, conversion efficiency, input phase difference and input impedance.
Figure 1B:
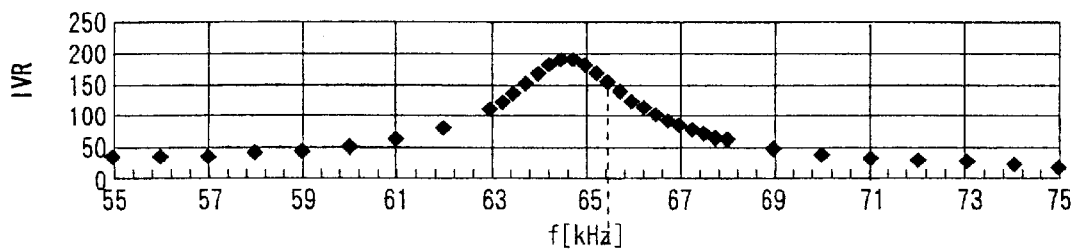
Figure 1C:
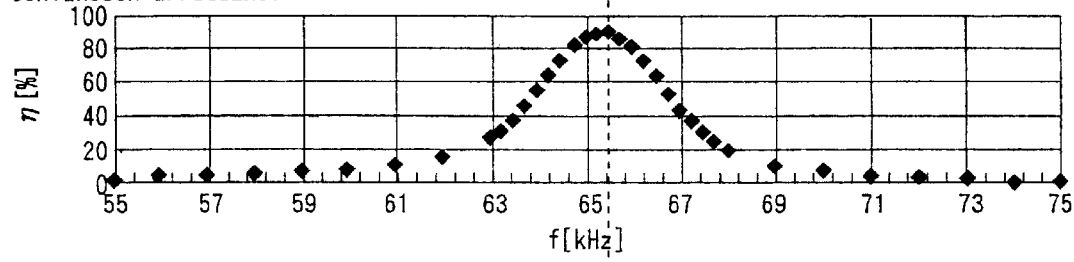
Figure 1D:
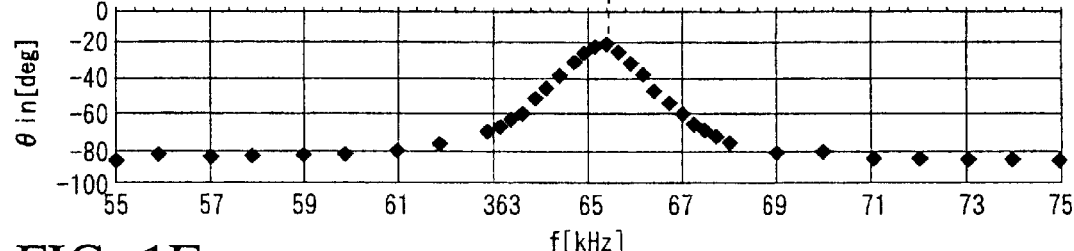
Figure 1E:
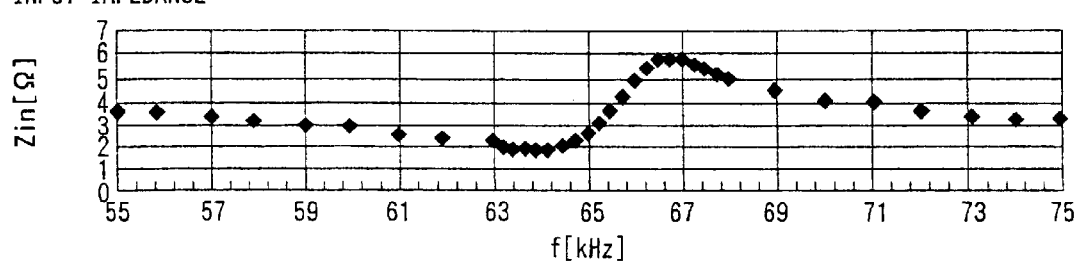
Figure 2A:
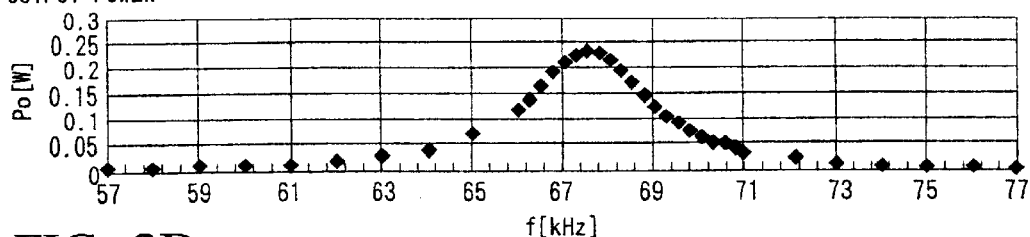
FIG. 2A to FIG. 2E illustrate other examples of frequency characteristics of a piezoelectric transformer with respect to output power, output voltage, conversion efficiency, input phase difference and input impedance.
Figure 2B:
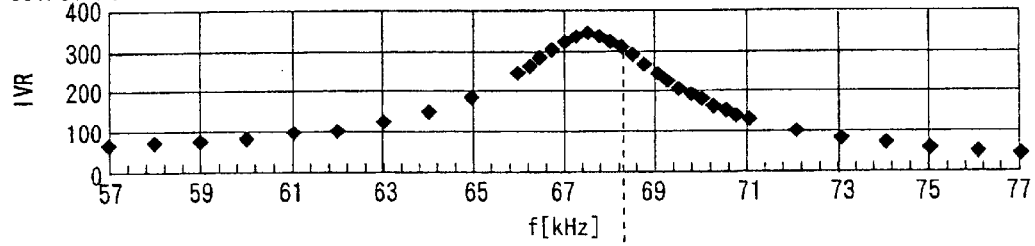
Figure 2C:
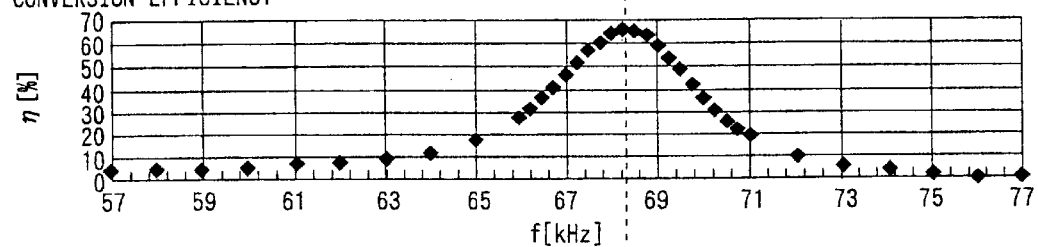
Figure 2D:
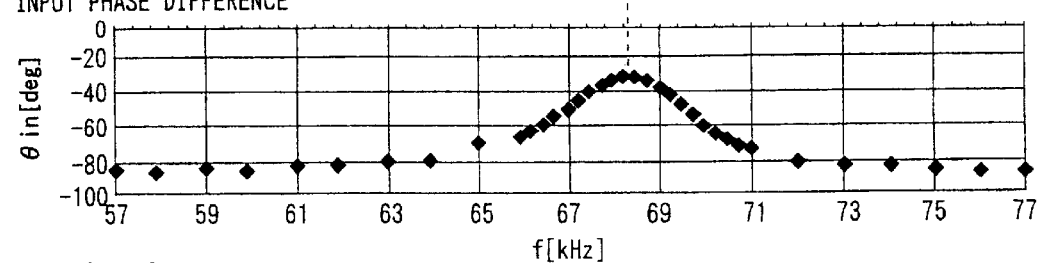
Figure 2E:
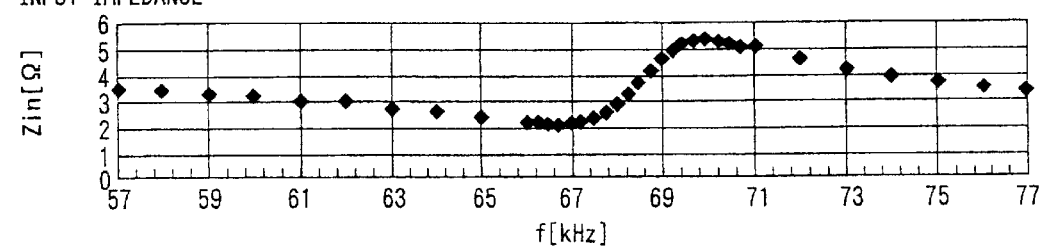
Figure 3A:
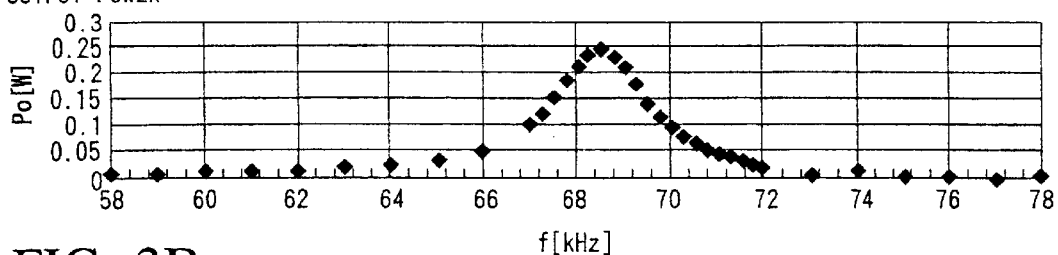
FIG. 3A to FIG. 3E illustrate still other examples of frequency characteristics of a piezoelectric transformer with respect to output power, output voltage, conversion efficiency, input phase difference and input impedance.
Figure 3B:
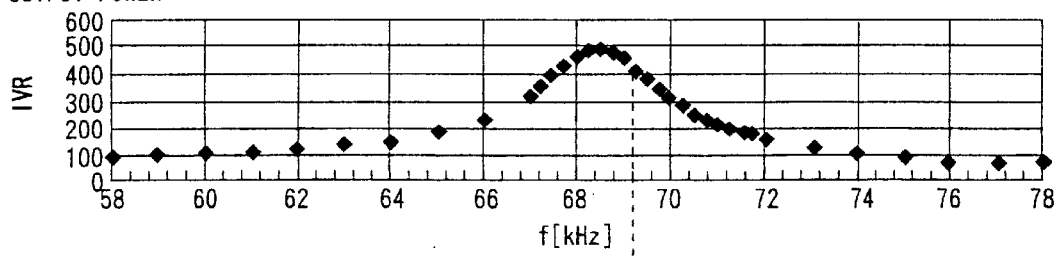
Figure 3C:
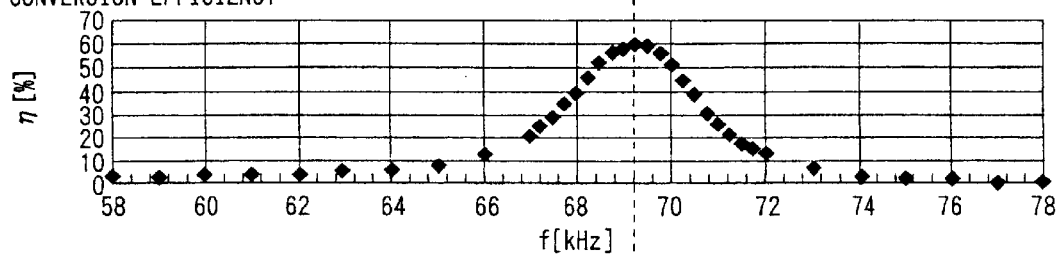
Figure 3D:
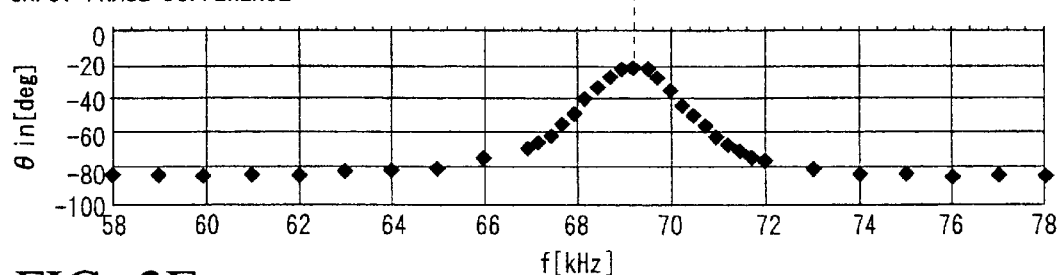
Figure 3E:
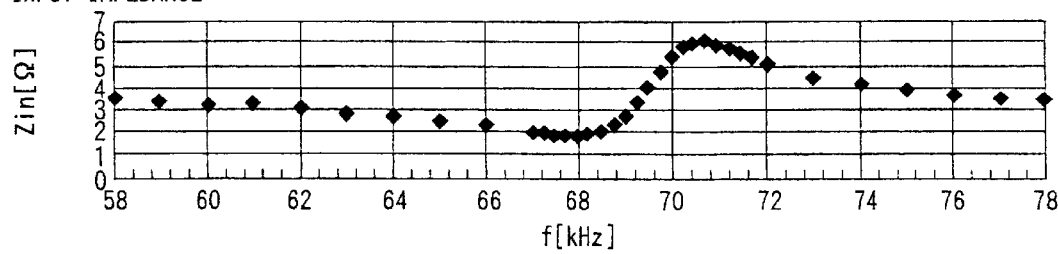
Figure 4:
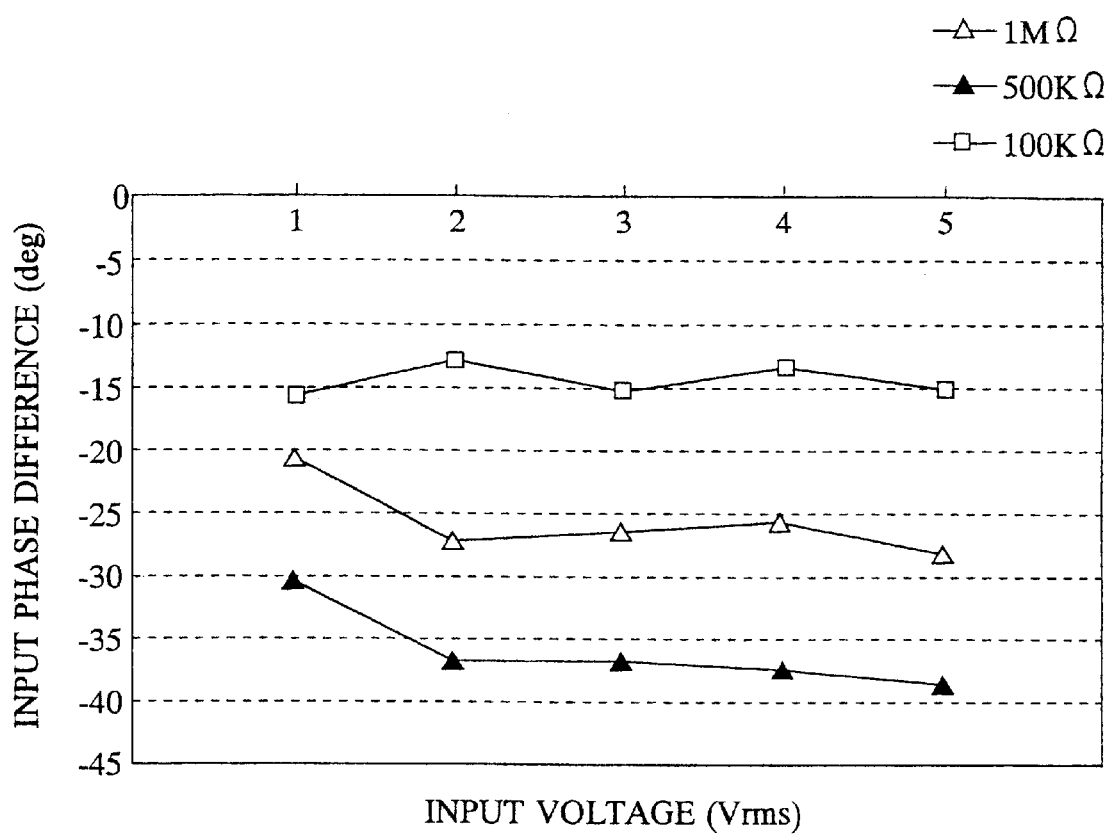
FIG. 4 illustrates an example of relationship between an input phase difference and input voltage at a maximum conversion efficiency under different load conditions.

FIG. 5 is a block diagram showing a first embodiment of a piezoelectric transformer drive apparatus of the present invention. FIG. 5 illustrates a configuration example of a power supply unit of a cold cathode discharge tube.

In FIG. 5, reference numeral 1 denotes a DC-DC converter; reference numeral 2, a voltage control oscillator (VCO) ; reference numeral 3, a signal processing section; reference numeral 4, a drive section; reference numeral 5, a filter; reference numeral 6, a piezoelectric transformer (PZT); reference numeral 7, a cold cathode discharge tube (CCFL); reference numeral 8, a band pass filter (BPF); reference numeral 9, an amplifier; reference numeral 10, a phase difference detector; reference numeral 11, a minimum value detector (differential circuit); reference numeral 12, a sweep circuit (sawtooth voltage generator); reference numeral 13, a sample-and-hold circuit; reference numeral 14, a current detector; reference numeral 15, an error amplifier; reference numeral 16, a dimmer; and Rs1 and Rs2 denote resistors for current detection.

The DC—DC converter 1 creates DC power with a predetermined voltage value from an external DC power supply with a wide range of voltage. This output voltage value is adjusted by a PWM control signal supplied from the error amplifier 15 and a burst signal supplied from the dimmer 16, which will be described later.

The voltage control oscillator 2 generates a sine wave AC signal with a frequency corresponding to the input voltage supplied from the sample-and-hold circuit 13. The signal processing section 3 converts the sine wave AC signal supplied from the voltage control oscillator 2 to a DC pulse signal.

The drive section 4, using the DC power supplied from the DC—DC converter 1 as a power supply and the pulse signal supplied from the signal processing section 3 as a switching signal, outputs rectangular-wave-figured switching power having a frequency generated by the voltage control oscillator 2 and a voltage value generated by the DC—DC converter 1. The filter 5 shapes the switching power input from the drive section 4 into a sine wave and supplies it to the primary side of the piezoelectric transformer 6.

The piezoelectric transformer 6 converts the voltage value of the output of the filter 5 applied to the primary side to a high voltage corresponding to the cold cathode discharge tube 7 and supplies this high voltage to the cold cathode discharge tube 7 connected to the secondary side.

The band pass filter 8 extracts only the frequency component corresponding to the input voltage from the voltage signal proportional to the input current on the primary side of the piezoelectric transformer 6 generated at the resistor Rs1 for current detection connected to the primary side of the piezoelectric transformer 6. The amplifier 9 amplifies the output signal of the band pass filter 8 to a level equivalent to that of the output signal of the filter 5.

The phase difference detector 10 receives the output signal of the filter 5 and the output signal of the amplifier 9 as inputs, detects a phase difference between the voltage and current on the primary side of the piezoelectric transformer 6 from these signals and outputs a signal corresponding to this phase difference as a phase difference signal. The minimum value detector 11 differentiates the phase difference signal supplied from the phase difference detector 10, detects its minimum value and outputs a pulse signal according to this detection timing.

The sweep circuit 12 generates a time-varying sweep voltage at predetermined regular intervals (normally, several seconds to several tens of seconds) and supplies it as an input voltage for the sample-and-hold circuit 13. Here, the sweep time above should be a time shorter than 1/60 second so that flickering of the cold cathode discharge tube 7 is not noticeable. The sweep voltage is set within a range in which the frequency of an AC signal output from the voltage control oscillator 2 is close to the resonance frequency of the piezoelectric transformer 6.

The sample-and-hold circuit 13 holds the sweep voltage supplied from the sweep circuit 12 upon reception of a timing pulse signal supplied from the minimum value detector 11, that is, when the phase difference between the input voltage and input current reaches a minimum value, and supplies this sweep voltage to the voltage control oscillator 2.

The current detector 14 generates and outputs a DC voltage corresponding to the level of a load current that flows through the cold cathode discharge tube 7 from a voltage signal generated at the resistor Rs2 for current detection connected to the cold cathode discharge tube 7. This voltage signal corresponds to the load current. The error amplifier 15 compares the output voltage of the current detector 14 with a predetermined reference voltage Vref and outputs a PWM control signal corresponding to the difference.

The dimmer 16 generates a burst signal to adjust the brightness of the cold cathode discharge tube 7 according to a brightness adjustment value supplied from outside.

In the above described configuration, a predetermined voltage value by the DC—DC converter 1 and sine wave AC power having an oscillation frequency generated by the voltage control oscillator 2 are applied to the primary side of the piezoelectric transformer 6. This applied AC power is converted by the piezoelectric transformer 6 and the high voltage AC power extracted from the secondary side is supplied to the cold cathode discharge tube 7. This supply power makes the cold cathode discharge tube 7 be turned on.

At this time, when the sweep circuit 12 generates a sweep voltage, the oscillation frequency of the voltage control oscillator 2 changes according to the voltage change and the frequency of the sine wave AC power applied to the primary side of the piezoelectric transformer 6 also changes. When the frequency of the signal applied to the primary side of the piezoelectric transformer 6 changes, the phase difference between the voltage and current also changes.

The phase difference above is detected by the phase difference detector 10 and if the minimum value detector 11 detects a minimum value of the phase difference, a timing pulse signal is output to the sample-and-hold circuit 13. Through this timing pulse signal, the sweep voltage value at that time is held in the sample-and-hold circuit 13 and the oscillation frequency of the voltage control oscillator 2 is fixed at a frequency corresponding to a minimum value of the phase difference above, that is, a frequency corresponding to a maximum value of the conversion efficiency.

As described above, a sweep voltage is generated at predetermined regular intervals, and therefore even if the resistance value of the cold cathode discharge tube 7 changes, the drive frequency of the piezoelectric transformer 6 deviates less from the frequency corresponding to the maximum value of conversion efficiency.

Figure 6A:
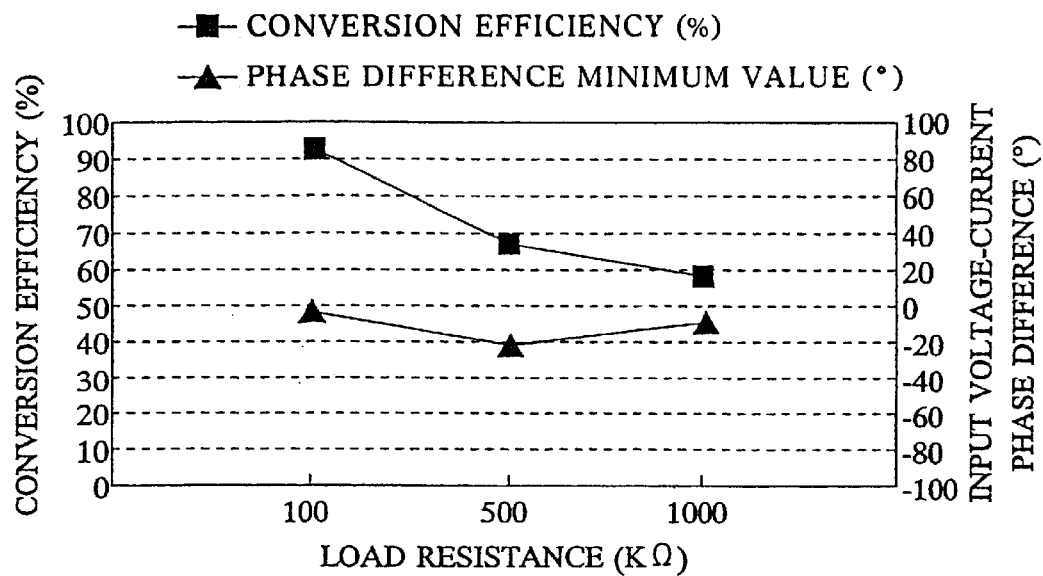
FIG. 6A and FIG. 6B illustrate a change of conversion efficiency when load resistance is changed.
Figure 6B:
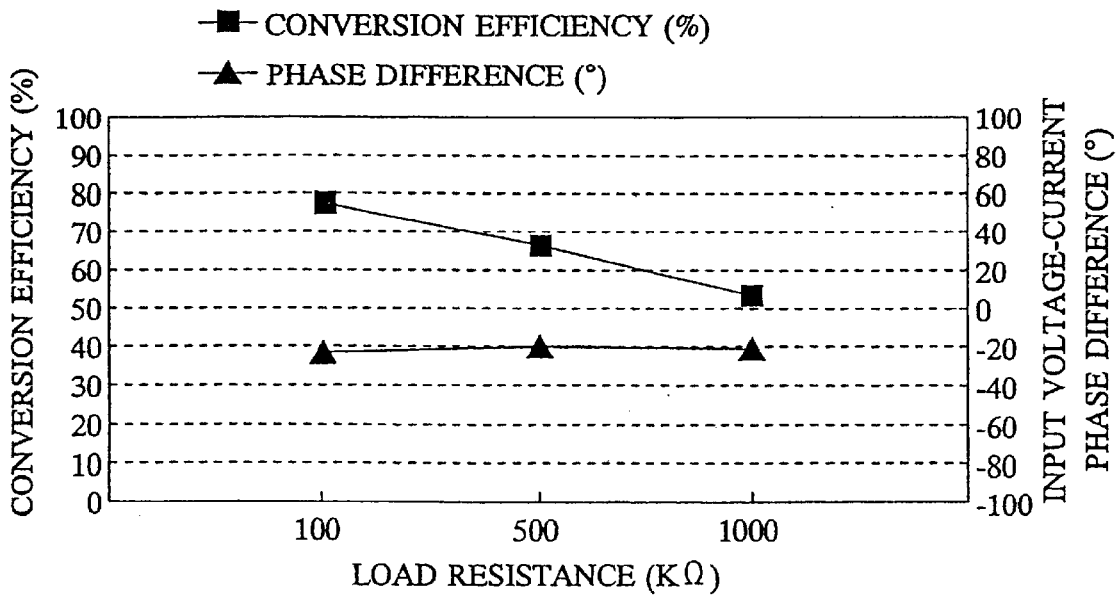

FIG. 6A and FIG. 6B illustrate how the conversion efficiency changes when load resistance is changed from 100 kΩ to 500 kΩ, 1 MΩ. FIG. 6A shows a case where the input phase difference is controlled to a minimum value (present invention) and FIG. 6B shows a case where the input phase difference is fixed at a certain value (minimum value for 500 kΩ) (conventional example). From these figures, it is clear that both when the load resistance decreases and when the load resistance increases, it is possible to obtain higher conversion efficiency than the conventional case by controlling the input phase difference to a minimum value.

Figure 7:
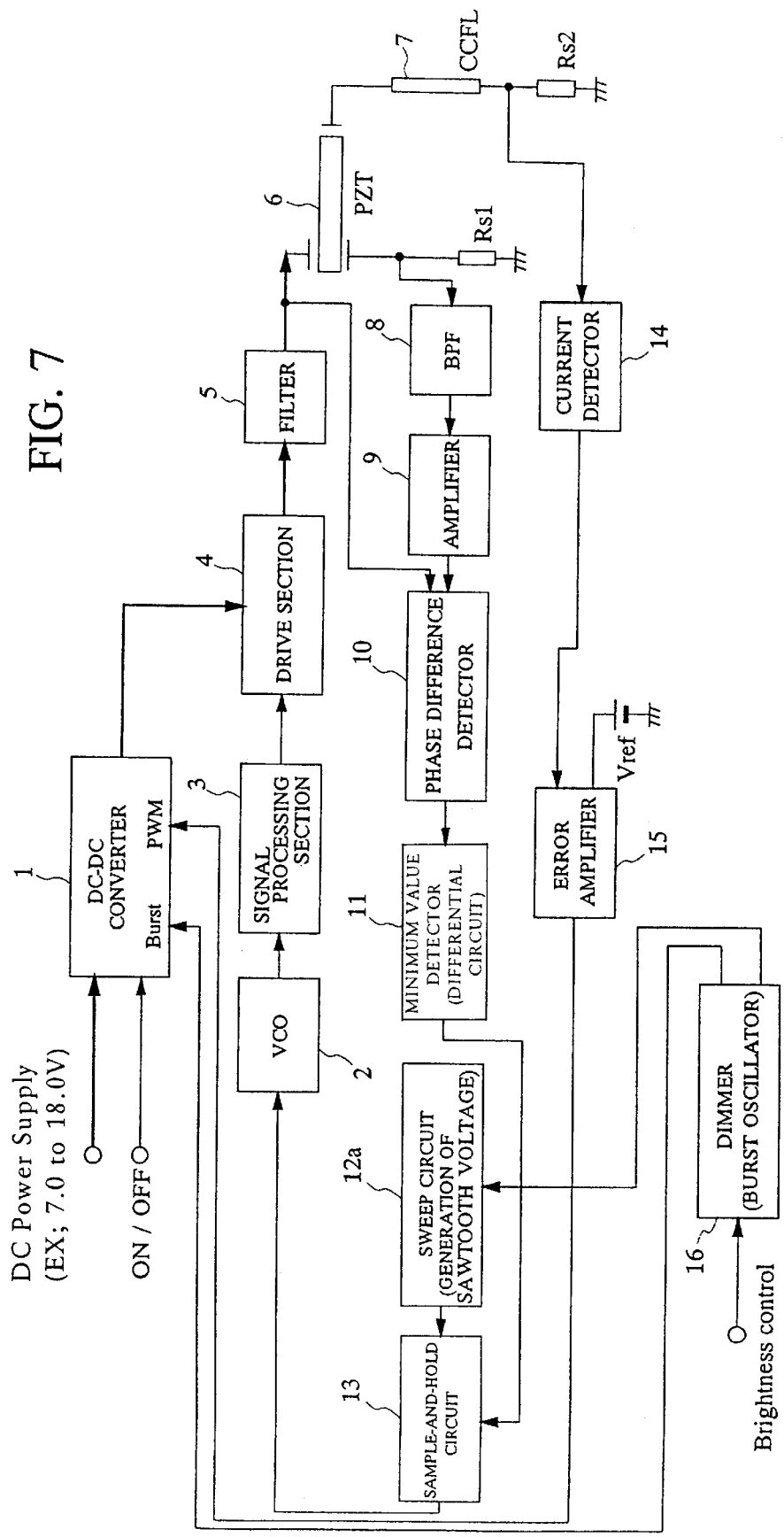
FIG. 7 is a block diagram showing a second embodiment of a piezoelectric transformer drive apparatus of the present invention.

FIG. 7 is a block diagram showing a second embodiment of a piezoelectric transformer drive apparatus of the present invention. This embodiment describes a case where a sweep voltage is also generated when the dimmer in the first embodiment adjusts brightness. That is, the output signal of the dimmer 16 is input to the sweep circuit 12a and the sweep circuit 12a generates a sweep voltage at predetermined regular intervals and also when the output signal of the dimmer 16 changes. This makes the drive frequency of the piezoelectric transformer 6 deviate less from the frequency corresponding to a maximum value of conversion efficiency even if the input condition (voltage) for the piezoelectric transformer 6 changes. The rest of the configuration and operation are the same as those in the first embodiment.

Moreover, in the first and second embodiments, by inputting a voltage lower than a sweep voltage held in the sample-and-hold circuit 13 through a timing pulse signal to the voltage control oscillator 2, it is possible to drive the piezoelectric transformer 6 at a frequency by 0 to 30% lower than the frequency corresponding to about a minimum value of the phase difference, that is, a frequency corresponding to about a minimum value of the output voltage. For example, by adding or subtracting a predetermined voltage offset to or from the output of the sample-and-hold circuit 13, or giving a predetermined phase offset to either one of the two signals input to the phase difference detector 10, it is possible to input a voltage lower than the sweep voltage at the time of holding to the voltage control oscillator 2.

Figure 8:
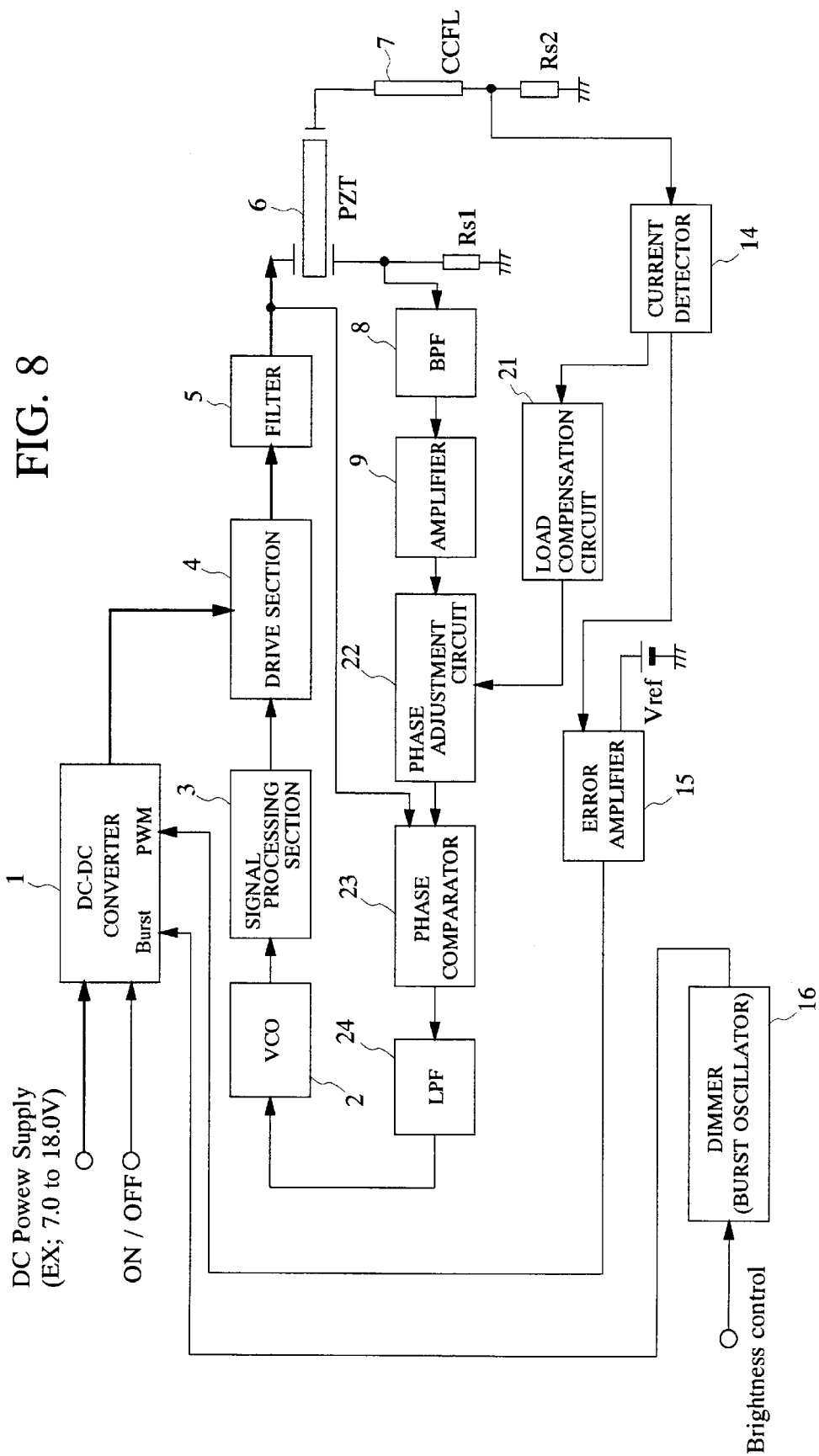
FIG. 8 is a block diagram showing a third embodiment of a piezoelectric transformer drive apparatus of the present invention.

FIG. 8 is a block diagram showing a third embodiment of a piezoelectric transformer drive apparatus of the present invention. This embodiment describes a case where the input phase difference is substantially controlled to a minimum value by inserting a unit that adjusts or corrects the phase according to changes in the load condition, etc. in a loop controlling the input phase difference to a fixed value. In the figure, reference numeral 21 denotes a load compensation circuit; reference numeral 22, a phase adjustment circuit; reference numeral 23, a phase comparator; and reference numeral 24, a low pass filter (LPF).

The load compensation circuit 21 detects the status of the cold cathode discharge tube 7 as a load from a DC voltage corresponding to the level of the load current output from the current detector 14. Based on this detection result, the load compensation circuit 21 further outputs a phase adjustment signal so that the phase difference between the voltage and current on the primary side of the piezoelectric transformer becomes a minimum value according to the characteristic (known characteristic) of the cold cathode discharge tube 7. The phase adjustment circuit 22 adjusts the phase of a voltage signal proportional to the current on the primary side of the piezoelectric transformer 6 output from the amplifier 9 based on the phase adjustment signal supplied from the load compensation circuit 21.

The phase comparator 23 receives the output signal of the filter 5 and the output signal of the phase adjustment circuit 22 as inputs and, using these, compares the phase of the voltage and the phase of the current on the primary side of the piezoelectric transformer (this is the phase adjusted according to the load condition). The phase comparator 23 further outputs a voltage holding a certain value when the phase difference of this comparison result reaches a minimum value under a predetermined load condition. The low pass filter 24 restricts the frequency band of the output signal of the phase comparator 23 and supplies this to the voltage control oscillator 2 and sets the response characteristic of the control loop.

In the aforementioned configuration, the phase comparator 23 compares the phase of the voltage and the phase of the current on the primary side of the piezoelectric transformer 6 and a voltage holding a certain value when the phase difference of this comparison result reaches a minimum value under a predetermined load condition is input to the voltage control oscillator 2 and the piezoelectric transformer 6 is driven at a frequency corresponding to this voltage.

In this case, if the load condition changes, that is, the resistance value of the cold cathode discharge tube 7 changes and the load current changes, the output signal of the load compensation circuit 21 also changes accordingly. Then, the phase adjustment circuit 22 adjusts the phase of the voltage signal indicating the phase of the current on the primary side of the piezoelectric transformer 6. This allows the output of the phase comparator 23 to be adjusted to such a voltage that will cause the voltage control oscillator 2 to generate a signal with a frequency corresponding to a minimum value of the phase difference between the voltage and current on the primary side of the piezoelectric transformer 6 according to the load condition at that time. Therefore, it is possible to drive the piezoelectric transformer 6 by inputting an AC signal with a frequency corresponding to a minimum value of the phase difference between the voltage and current on the primary side of the piezoelectric transformer 6 without directly detecting that minimum value. The rest of the configuration and operation are the same as those in the first embodiment.

Figure 9:
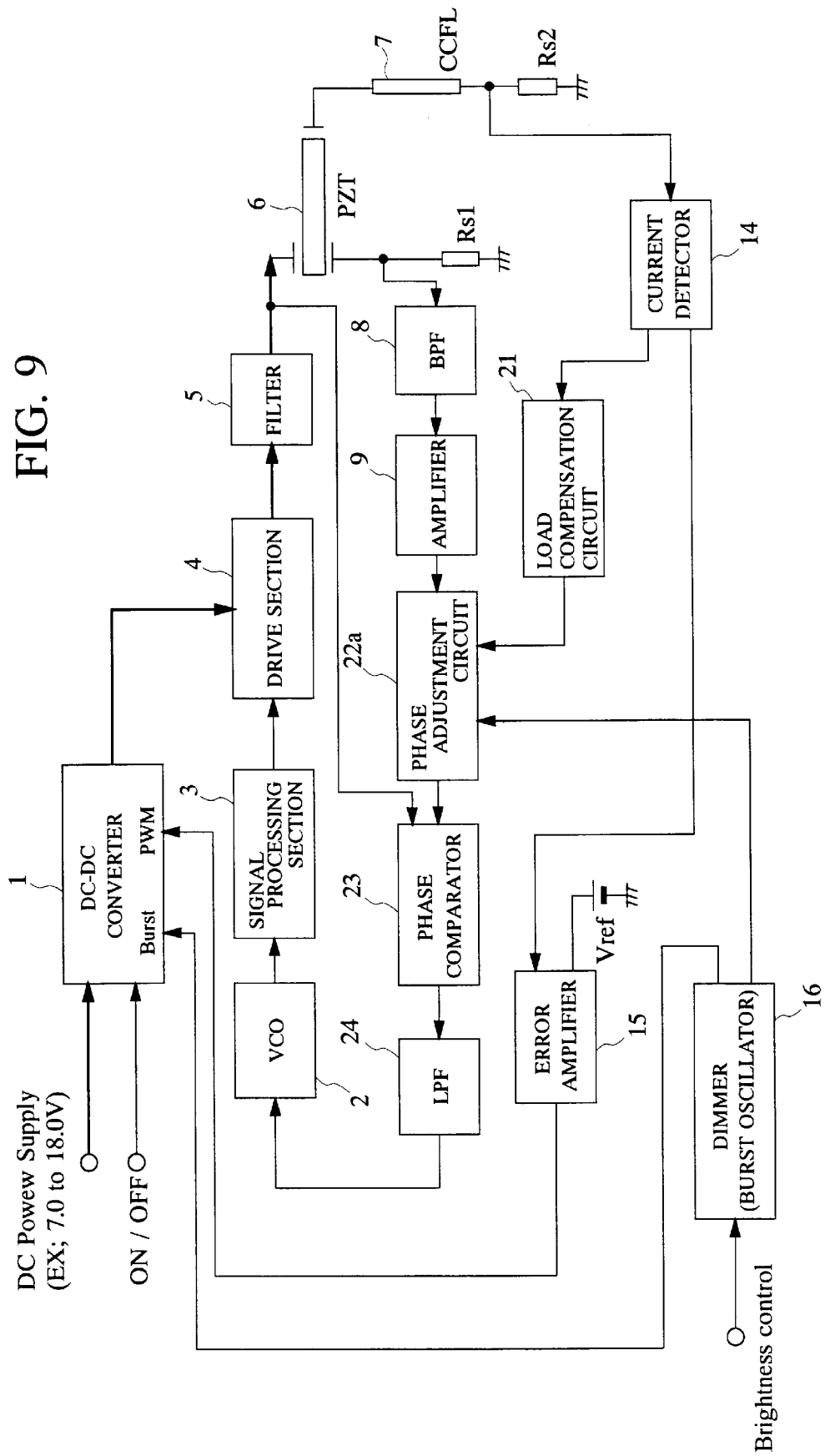
FIG. 9 is a block diagram showing a fourth embodiment of a piezoelectric transformer drive apparatus of the present invention.

FIG. 9 is a block diagram showing a fourth embodiment of a piezoelectric transformer drive apparatus of the present invention. This embodiment describes a case where the phase is also adjusted (corrected) even when the dimmer in the third embodiment adjusts brightness. That is, the phase adjustment circuit 22a also receives the output signal of the dimmer 16 as an input and the phase adjustment circuit 22a changes the phase corresponding to the current on the primary side of the piezoelectric transformer 6 according not only to the output signal of the load compensation circuit 21 but also to the output signal of the dimmer 16. This reduces deviation from the frequency corresponding to a maximum value of conversion efficiency even if the input condition (voltage) for the piezoelectric transformer changes. The rest of the configuration and operation are the same as those in the third embodiment.

Moreover, in the third and fourth embodiments, it is possible to drive the piezoelectric transformer 6 at a frequency by 0 to 30% lower than the frequency corresponding to a minimum value of the phase difference, that is, a frequency corresponding to about a minimum value of the output voltage by giving a predetermined phase offset beforehand together with the phase adjustment signal from the load compensation circuit 21 (and dimmer 16) as an amount of phase adjustment in the phase adjustment circuit 22 (22a) or by holding the output voltage of the phase comparator 23 to a certain value higher than a value when the phase difference between the two input signals reaches a minimum value under a predetermined load condition.

As described above, according to the present invention, it is possible to drive the piezoelectric transformer with maximum conversion efficiency or supply a relatively high output voltage even if the input voltage level, load and temperature, etc. are changed.

The present invention can be implemented in various modes within the scope without departing from the spirit or main features thereof. Therefore, it is noted that the foregoing embodiments have been provided merely for the purpose of explanation and are in no way to be construed as limiting of the present invention. The scope of the present invention is indicated by the appended claims and the present invention is not intended to be limited to the text of the specification. Any modifications or changes within the equivalent scope of the appended claims are within the purview of the present invention.

What is claimed is:

1. A method of driving a piezoelectric transformer, the transformer being arranged for converting a voltage and a current of AC supplied to a primary side of the transformer into an AC output at a secondary side of the transformer, the method comprising driving the piezoelectric transformer primary side with AC having a frequency causing a minimum phase difference between the voltage and current on the primary side of the piezoelectric transformer.

2. The piezoelectric transformer drive method according to claim 1, further including driving the piezoelectric transformer primary side with AC having a frequency lower than the frequency which causes the minimum value of said phase difference, the lower frequency being 0 to 30% of the difference between a resonance frequency and an antiresonance frequency of the piezoelectric transformer.

3. In combination,
a piezoelectric transformer having a primary side and a secondary side,
a drive for the piezoelectric transformer for converting AC voltage and current supplied to the primary side into AC at the secondary side of the piezoelectric transformer,
the drive including: a frequency controller for controlling the frequency of said AC supplied to the primary side for causing a minimum phase difference to exist between the voltage and current on the primary side of the piezoelectric transformer.

4. The combination of claim 3, wherein:
the frequency controller is arranged for controlling the frequency of said supplied AC so that said frequency is lower than a frequency which causes the minimum value of said phase difference, said frequency being controlled so it is a frequency that is lower by 0 to 30% of the difference between a resonance frequency and an antiresonance frequency of the piezoelectric transformer.

5. The combination of claim 2, wherein said frequency control means comprises:
- a circuit for sweeping the frequency of said AC;
- a detector for detecting the phase difference between the voltage and current on the primary side of the piezoelectric transformer;
- a detector for detecting said phase difference minimum value; and
- circuitry for holding the frequency of said supplied AC in response to said minimum value being obtained.

6. The combination of claim 5, wherein the frequency of said AC is swept at predetermined regular intervals.

7. The combination of claim 3, wherein said frequency controller comprises:
- a voltage controlled oscillator for generating an AC signal with a frequency corresponding to an input voltage of the primary side;
- a sweep circuit for generating a time-varying sweep voltage as the input voltage for said voltage controlled oscillator;
- a phase difference detector for detecting a phase difference between the voltage and current on the primary side of the piezoelectric transformer and for deriving a signal corresponding to said phase difference;
- a minimum value detection circuit for detecting a minimum value of said phase difference signal; and
- a sample-and-hold circuit for supplying said sweep voltage to the voltage controlled oscillator and holding a voltage in response to said minimum value being obtained and supplying it to the voltage controlled oscillator.

8. The combination of claim 7, wherein the frequency of said AC signal is swept at predetermined regular intervals.

9. The combination of claim 3, wherein said frequency controller comprises:
- a voltage controlled oscillator for generating an AC signal with a frequency corresponding to an input voltage;
- a phase comparator for comparing the phases of the voltage and the current on the primary side of the piezoelectric transformer and for supplying a voltage that holds a certain value when the phase difference reaches a minimum value under a predetermined load condition to the voltage controlled oscillator; and
- a phase adjustment circuit for adjusting the phase of input supplied to said phase comparator according to changes in the load condition of the transformer.

10. The combination of claim 9, wherein the amount of phase adjustment by said phase adjustment circuit is arranged to control adjustments to the amount of power to be supplied to the load.

11. The combination of claim 5, wherein the frequency of said AC is swept in response to a change in a condition of a load connected to be responsive to an output of the transformer or an input condition at the primary side.

12. The combination of claim 7, wherein the frequency of said AC signal is swept in response to a change in a load condition or input condition of the transformer.

* * * * *